US012765115B2

(12) United States Patent
Becker et al.

(10) Patent No.: US 12,765,115 B2
(45) Date of Patent: Oct. 13, 2026

(54) BIFACIAL ENHANCEMENT LAYERS AND PHOTOVOLTAIC DEVICES INCLUDING THE SAME

(71) Applicant: First Solar, Inc., Tempe, AZ (US)

(72) Inventors: James Becker, Perrysburg, OH (US); William Huber, Ottawa Hills, OH (US); Chungho Lee, San Jose, CA (US); Jialiu Ma, Perrysburg, OH (US); Dirk Weiss, Corvallis, CA (US); Gang Xiong, Santa Clara, CA (US)

(73) Assignee: First Solar, Inc., Phoenix, AZ (US)

( * ) Notice: Subject to any disclaimer, the term of this patent is extended or adjusted under 35 U.S.C. 154(b) by 0 days.

(21) Appl. No.: 18/703,192

(22) PCT Filed: Oct. 26, 2022

(86) PCT No.: PCT/US2022/047821
§ 371 (c)(1),
(2) Date: Apr. 19, 2024

(87) PCT Pub. No.: WO2023/076339
PCT Pub. Date: May 4, 2023

(65) Prior Publication Data

US 2024/0413254 A1 Dec. 12, 2024

Related U.S. Application Data

(60) Provisional application No. 63/271,882, filed on Oct. 26, 2021.

(51) Int. Cl.
*H10F 77/30* (2025.01)
*H10F 77/45* (2025.01)

(52) U.S. Cl.
CPC .......... *H10F 77/315* (2025.01); *H10F 77/45* (2025.01)

(58) Field of Classification Search
CPC ....... H10F 77/315; H10F 77/45; H10F 71/125
See application file for complete search history.

(56) References Cited

U.S. PATENT DOCUMENTS

| | | | |
|---|---|---|---|
| 5,505,928 | A | 4/1996 | Alivisatos et al. |
| 5,751,018 | A | 5/1998 | Alivisatos et al. |
| 6,207,229 | B1 | 3/2001 | Bawendi et al. |
| 6,444,897 | B1 | 9/2002 | Luque-Lopez et al. |
| 6,503,831 | B2 | 1/2003 | Speakman |
| 6,566,595 | B2 | 5/2003 | Suzuki |
| 6,838,243 | B2 | 1/2005 | Lai et al. |
| 6,852,920 | B2 | 2/2005 | Sager et al. |
| 6,855,202 | B2 | 2/2005 | Alivisatos et al. |
| 7,042,029 | B2 | 5/2006 | Graetzel et al. |
| 7,144,458 | B2 | 12/2006 | Zehnder et al. |

(Continued)

FOREIGN PATENT DOCUMENTS

| | | | |
|---|---|---|---|
| WO | 2008085933 | A1 | 7/2008 |
| WO | 2015129586 | A1 | 9/2015 |

OTHER PUBLICATIONS

Jeong (Year: 2017).*

(Continued)

*Primary Examiner* — Sadie White
(74) *Attorney, Agent, or Firm* — MacMillan, Sobanski & Todd, LLC

(57) ABSTRACT

Photovoltaic devices having bifacial enhancement are described herein.

20 Claims, 7 Drawing Sheets

(56) References Cited

U.S. PATENT DOCUMENTS 7,147,712 B2 12/2006 Zehnder et al.
7,147,917 B2 12/2006 Adams et al.
7,228,050 B1 6/2007 Buretea et al.
8,022,292 B2 9/2011 Arianpour et al.
8,039,736 B2 10/2011 Clark et al.
8,072,039 B2 12/2011 Cho et al.
8,822,259 B2 9/2014 Singh et al.
8,860,165 B2 10/2014 Okaniwa et al.
8,927,852 B2 1/2015 Richter et al.
8,952,239 B2 2/2015 Pfenninger et al.
9,117,954 B2 8/2015 Jiawook
9,263,600 B2 2/2016 Nayfeh et al.
9,394,479 B2 7/2016 Zhang et al.
9,406,819 B2 8/2016 Pelouard et al.
9,520,521 B2 12/2016 Schiffmann et al.
9,537,022 B2 1/2017 Liu et al.
9,614,108 B1 * 4/2017 Sood .................... H10F 77/707
9,795,542 B2 10/2017 Nagashima et al.
9,966,482 B2 5/2018 Lee
9,966,488 B2 5/2018 Ko et al.
10,840,403 B2 11/2020 Kurtin et al.
10,847,666 B2 11/2020 Bourke, Jr. et al.
10,930,807 B2 2/2021 Ishiguro et al.
10,982,136 B2 4/2021 Agbo et al.
11,217,761 B2 1/2022 Rao et al.
11,495,703 B2 11/2022 Kurtin et al.
11,680,204 B2 6/2023 Jang et al.
11,929,443 B1 3/2024 Klimov
2006/0062902 A1 3/2006 Sager et al.
2009/0095341 A1 * 4/2009 Pfenninger ........... H10F 77/492 136/246
2010/0122720 A1 * 5/2010 Clark ...................... H10F 77/45 136/244
2010/0163104 A1 * 7/2010 Tseng .................... H10F 77/211 136/256
2010/0243053 A1 9/2010 Coe-Sullivan et al.
2014/0094025 A1 * 4/2014 Korevaar ............. H10F 77/126 257/E21.144
2018/0315900 A1 * 11/2018 Lu ....................... H10F 77/1433
2019/0296174 A1 * 9/2019 Gloeckler ............ H10F 77/251

OTHER PUBLICATIONS

Nishimura (Year: 2020).*
Kainarbay (Year: 2018).*
Kalytchuk (Year: 2014).*
Kim (Year: 2020).*
Uematsu (Year: 2009).*
PCT International Search Report and Written Opinion, Application No. PCT/US2022/047821, dated Feb. 13, 2023.
Ghazy et al., "Luminescent (Er,Ho)2O3 thin films by ALD to enhance the performance of silicon solar cells", Solar Energy Materials and Solar Cells, Science Direct, (2020), pp. 1-5.
Goldmann et al., "Structural and emission properties of InGaAs/GaAs quantum dots emitting at 1.3 μm", Applied Physics Letters, (2014), vol. 105, pp. 152102-1-152102-5.
Schneider et al., "AlGaInAs quantum dot solar cells: tailoring quantum dots for intermediate band formation", Semiconductor Science and Technology, (2012), vol. 27, pp. 1-5.
Wheeler et al., "Semi-Transparent Solar Cell enabled by Frequency Selective Light Trapping", physics.app-ph, (2017), pp. 1-9.
Wu et al., "Quantum dot optoelectronic devices: lasers, photodetectors and solar cells", Journal of Physics D: Applied Physics, (2015), vol. 48, pp. 1-28.
Xie et al., "Formation of High-Quality I#III#VI Semiconductor Nanocrystals by Tuning Relative Reactivity of Cationic Precursors", Journal of The American Chemical Society, (2009), vol. 131, No. 15, pp. 5692-5697.
Jeong et al., "Improving Ultraviolet Responses in Cu2ZnSn(S,Se)4 Thin-Film Solar Cells Using Quantum Dot-Based Luminescent Down-Shifting Layer," Nanomaterials, 2021, vol. 11, pp. 1-10.
Government of India, Examination Report, dated Aug. 17, 2026, Application No. 202417031141.

* cited by examiner

BIFACIAL ENHANCEMENT LAYERS AND PHOTOVOLTAIC DEVICES INCLUDING THE SAME

CROSS-REFERENCE TO RELATED APPLICATIONS

This is a national phase application of international application PCT/US2022/047821, filed on Oct. 26, 2022, and claims the benefit of U.S. Provisional Application No. 63/271,882 filed on Oct. 26, 2021, each of which is incorporated by reference in the entirety.

BACKGROUND

The present specification generally relates to bifacial enhancement layers for photovoltaic devices and, more specifically, to the use of bifacial enhancement layers to improve the bifacial efficiency of thin film photovoltaic devices.

A photovoltaic device generates electrical power by converting light into electrical power using semiconductor materials that exhibit the photovoltaic effect. Monofacial photovoltaic devices are configured to receive sunlight from a single side of the device. Bifacial photovoltaic devices are configured to receive sunlight from two sides of the device. For example, a bifacial photovoltaic device can include surface facing the sun to collect direct sunlight, and an opposite surface facing towards the earth to collect reflected sunlight, i.e., albedo reflectance. Generally, bifacial modules can generate more power per installed area than monofacial modules. While silicon based semiconductor materials are amenable towards use in bifacial photovoltaic devices, thin film based semiconductor materials can be more difficult to implement in bifacial photovoltaic devices. The properties limiting the use of thin film based semiconductor materials in bifacial photovoltaic devices are not fully understood.

Accordingly, a need exists for alternative bifacial enhancement layers for use in photovoltaic devices.

DETAILED DESCRIPTION

Photovoltaic devices can be formed from a stack of functional layers formed over a substrate. Thin film photovoltaic devices can include an absorber layer for converting light into charge carriers, formed from depositing a layer of semiconductor material. The embodiments provided herein relate to bifacial enhancement layers and photovoltaic devices including the same. The disclosed bifacial enhancement layers can improve quantum efficiency of the thin film photovoltaic device to albedo reflectance. As used herein, albedo reflectance refers to solar energy reflected from objects near the photovoltaic device such as, but not limited to, the surfaces below the photovoltaic device.

Figure 1:
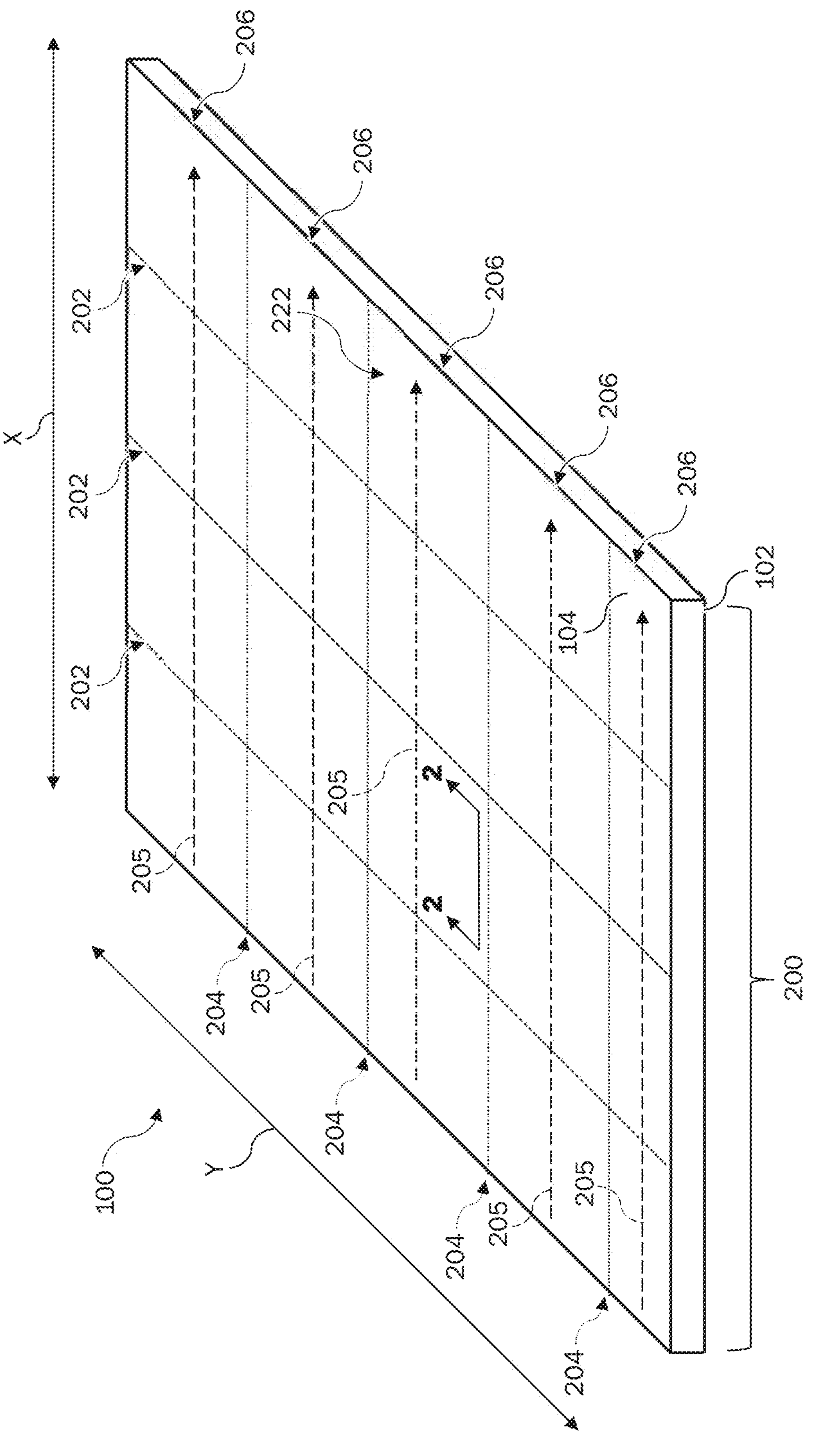
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical energy, e.g., photons can be absorbed from the light and transformed into electrical current via the photovoltaic effect. Thus, for sake of discussion and clarity, the photovoltaic device 100 can define a front side 102 configured to face a primary light source such as, for example, the sun. Additionally, the photovoltaic device 100 can also define a back side 104 offset from the front side 102 such as, for example, by a plurality of functional layers of material. In operation, the back side 104 of the photovoltaic device 100 can be configured to configured to face a secondary light source, i.e., a source of albedo reflectance. For example, sunlight can be reflected by objects near the photovoltaic device 100. Generally, the earth, i.e., sand, soil, rocks, or some ground cover such as, for example, vegetation, snow, or water can be sources of albedo reflectance. In some instances, albedo reflectance can be enhanced by focusing sunlight with high reflectance objects, e.g., metallic objects or surface coatings. It is noted that the term “light” can refer to various wavelengths of the electromagnetic spectrum such as, but not limited to, wavelengths in the ultraviolet (UV), infrared (IR), and visible portions of the electromagnetic spectrum. “Sunlight,” as used herein, refers to light emitted by the sun.

The photovoltaic device 100 can include a plurality of layers disposed between the front side 102 and the back side 104. As used herein, the term “layer” refers to a thickness of material provided upon a surface. Each layer can cover all or any portion of an adjacent surface. In some embodiments, the layers of the photovoltaic device 100 can be divided into an array of photovoltaic cells 200. For example, the photovoltaic device 100 can be scribed according to a plurality of serial scribes 202 and a plurality of parallel scribes 204. The serial scribes 202 can extend along a length Y of the photovoltaic device 100 and demarcate the photovoltaic cells 200 along the length Y of the photovoltaic device 100. Neighboring cells of the photovoltaic cells 200 can be serially connected along a width X of the photovoltaic device 100. In other words, a monolithic interconnect of the neighboring cells 200 can be formed, i.e., adjacent to the serial scribe 202. The parallel scribes 204 can extend along the width X of the photovoltaic device 100 and demarcate the photovoltaic cells 200 along the width X of the photovoltaic device 100. Under operations, current 205 can predominantly flow along the width X through the photovoltaic cells 200 serially connected by the serial scribes 202. Under operations, parallel scribes 204 can limit the ability of current 205 to flow along the length Y. Parallel scribes 204 are optional and can be configured to separate the photovoltaic cells 200 that are connected serially into groups 206 arranged along length Y.

Referring still to FIG. 1, the parallel scribes 204 can electrically isolate the groups 206 of photovoltaic cells 200 that are connected serially. In some embodiments, the groups 206 of the photovoltaic cells 200 can be connected in parallel such as, for example, via electrical bussing. Optionally, the number of parallel scribes 204 can be configured to limit a maximum current generated by each group 206 of the photovoltaic cells 200. In some embodiments, the maximum current generated by each group 206 can be less than or equal to about 200 milliamps (mA) such as, for example, less than or equal to about 100 mA in one embodiment, less than or equal to about 75 mA in another embodiment, or less than or equal to about 50 mA in a further embodiment.

Figure 2:
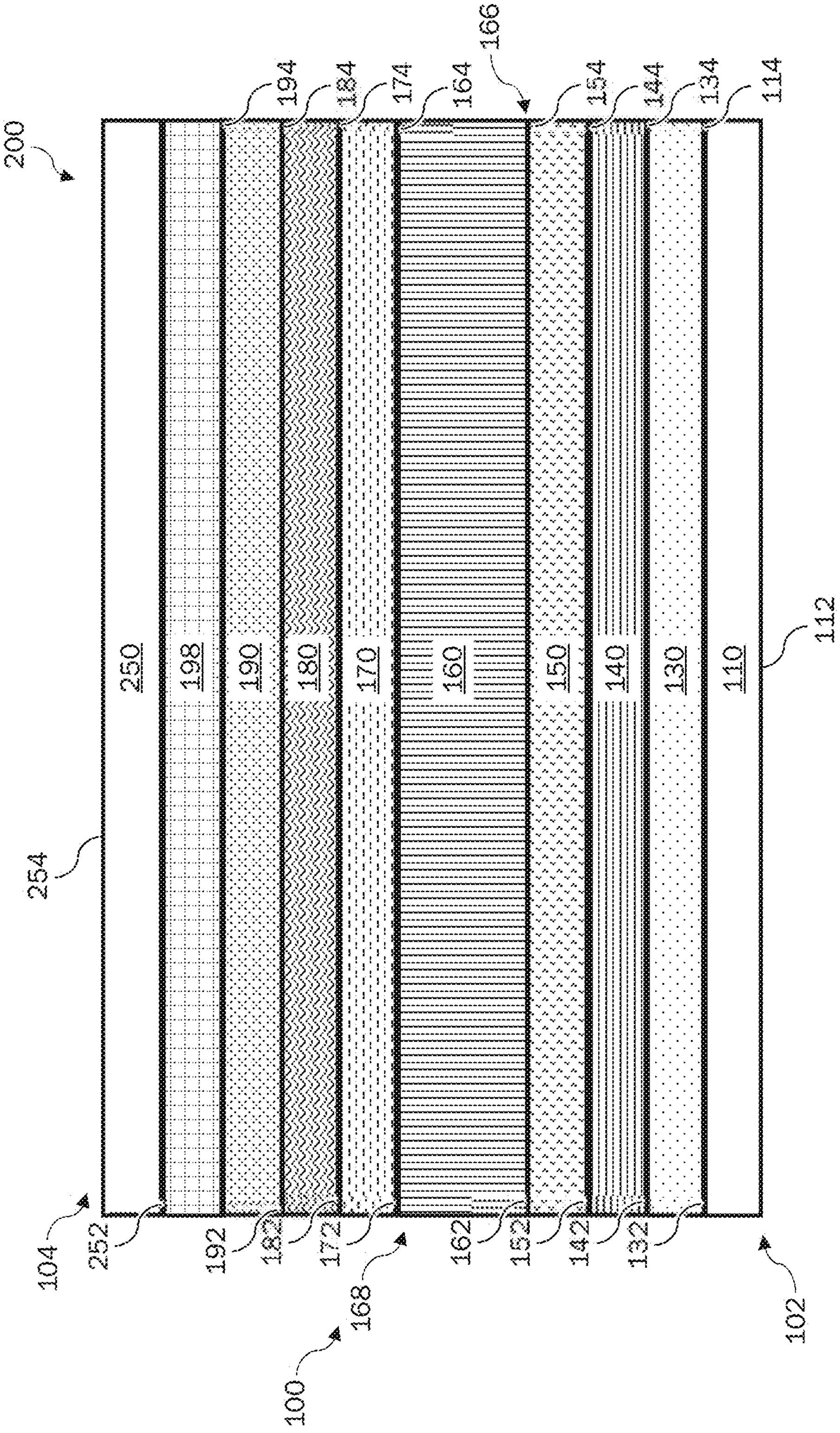
FIG. 2 schematically depicts a cross-sectional view along 2-2 of the photovoltaic device of FIG. 1 according to one or more embodiments shown and described herein.
Figure 3:
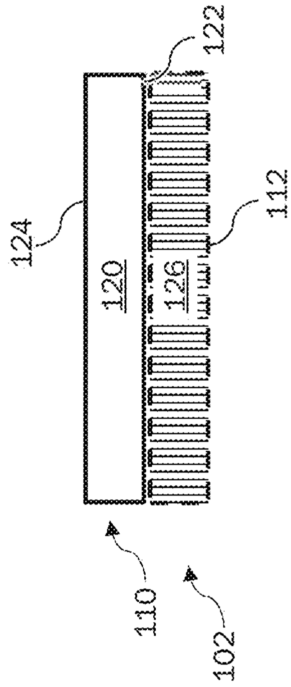
FIG. 3 schematically depicts a substrate according to one or more embodiments shown and described herein.

Referring now to FIG. 2, the layers of the photovoltaic device 100 can include a thin film stack provided over a substrate 110. The substrate 110 can be configured to facilitate the transmission of light into the photovoltaic device 100. The substrate 110 can be disposed at the front side 102 of the photovoltaic device 100. Referring collectively to FIGS. 2 and 3, the substrate 110 can have a first surface 112 substantially facing the front side 102 of the photovoltaic device 100 and a second surface 114 substantially facing the back side 104 of the photovoltaic device 100. One or more layers of material can be disposed between the first surface 112 and the second surface 114 of the substrate 110. As used herein, the term "over" can mean that a first layer is positioned relative to second layer in a stack with or without any intervening layers or intervening materials between at least a portion of the first layer and the second layer.

Referring to FIG. 3, the substrate 110 can include a transparent layer 120 having a first surface 122 substantially facing the front side 102 of the photovoltaic device 100 and a second surface 124 substantially facing the back side 104 of the photovoltaic device 100. In some embodiments, the second surface 124 of the transparent layer 120 can form the second surface 114 of the substrate 110. The transparent layer 120 can be formed from a substantially transparent material such as, for example, glass. Suitable glass can include soda-lime glass, or any glass with reduced iron content. As used herein, the term "transparent" refers to an object having an average transmittance of at least about 50% over a transmittance range from about 600 nm to about 1,100 nm. In some embodiments, transparent objects can have increased average transmittance, a broader transmittance range, or both. The transparent layer 120 can have an average transmittance percentage of at least 80% over a transmittance range from about 250 nm to about 1,300 nm, including, for example, more than about 80% in one embodiment, or more than about 85% in still another embodiment. In one embodiment, transparent layer 120 can be formed from a glass with about 90% transmittance, or more over the transmittance range from about 250 nm to about 1,300 nm. Optionally, the substrate 110 can include a coating 126 applied to the first surface 122 of the transparent layer 120. The coating 126 can be configured to interact with light or to improve durability of the substrate 110 such as, but not limited to, an antireflective coating, an antisoiling coating, or a combination thereof.

Referring again to FIG. 2, the photovoltaic device 100 can include a barrier layer 130 configured to mitigate diffusion of contaminants (e.g., sodium) from the substrate 110, which could result in degradation or delamination of other layers of the photovoltaic stack. The barrier layer 130 can have a first surface 132 substantially facing the front side 102 of the photovoltaic device 100 and a second surface 134 substantially facing the back side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that a first layer and a second layer are disposed contiguously and without any intervening materials between at least a portion of the first layer and the second layer. Accordingly, at least a portion of the first layer and the second layer are in direct contact with one another.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, between 5 nm and 50 nm, more than about 10 nm in one embodiment, more than about 15 nm in another embodiment, less than 30 nm, or less than about 20 nm in a further embodiment.

Referring still to FIG. 2, the photovoltaic device 100 can include a transparent conductive oxide (TCO) layer 140 configured to provide electrical contact to transport charge carriers generated by the photovoltaic device 100. The TCO layer 140 can have a first surface 142 substantially facing the front side 102 of the photovoltaic device 100 and a second surface 144 substantially facing the back side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. The TCO layer 140 can an average transmittance of at least 75% over a transmittance range from about 400 nm to about 900 nm. The wide band gap of the TCO layer 140 can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate ($Cd_2SnO_4$). In embodiments where the TCO layer 140 comprises cadmium stannate, the cadmium stannate can be provided in a crystalline form. For example, the cadmium stannate can be deposited as a film and then subjected to an annealing process, which transforms the thin film into a crystallized film.

The photovoltaic device 100 can include a buffer layer 150 configured to provide an insulating layer between the TCO layer 140 and any adjacent semiconductor layers. The buffer layer 150 can have a first surface 152 substantially facing the front side 102 of the photovoltaic device 100 and a second surface 154 substantially facing the back side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 150 can include material having higher resistivity than the TCO later 140, including, but not limited to, intrinsic tin dioxide, zinc magnesium oxide (e.g., $Zn_{1-x}Mg_xO$), silicon dioxide ($SiO_2$), aluminum oxide ($Al_2O_3$), aluminum nitride (AlN), zinc tin oxide, zinc oxide, tin silicon oxide, or any combination thereof. In some embodiments, the material of the buffer layer 150 can be configured to substantially match the conduction band energy of an adjacent semiconductor layer (e.g., an absorber). The buffer layer 150 has a thickness between the first surface 152 and the second surface 154, including, for example, between 10 nm and 150 nm, more than about 10 nm in one embodiment, between about 10 nm and about 80 nm in another embodiment, or between about 15 nm and about 60 nm in a further embodiment.

Referring still to FIG. 2, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical energy. The absorber layer 160 can have a first surface 162 substantially facing the front side 102 of the photovoltaic device 100 and a second surface 164 substantially facing the back side 104 of the photovoltaic device 100. A thickness of the absorber layer 160 can be defined between the first surface 162 and the second surface 164. The thickness of the absorber layer 160 can be between about 500 nm to about 10,000 nm such as, for example, between about 1000 nm to about 7000 nm in one embodiment, or between about 1500 nm to about 4000 nm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors such as, for example, cadmium and tellurium. Further examples include, but not limited to, semiconductor materials comprising cadmium, zinc, tellurium, selenium, or any combination thereof. In some embodiments, the absorber layer 160 can include ternaries of cadmium, selenium and tellurium (e.g., $CdSe_xTe_{1-x}$), or a compound comprising cadmium, selenium, tellurium, and one or more additional element (e.g., CdZnSeTe). The absorber layer 160 may further comprise one or more dopants. The photovoltaic devices 100 provided herein may include a plurality of absorber materials.

In embodiments where the absorber layer 160 comprises tellurium and cadmium, the average atomic percent of the tellurium in the absorber layer 160 can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively or additionally, average atomic percent of the tellurium in the absorber layer 160 can be greater than about 45 atomic percent such as, for example, greater than about 49% in one embodiment. It is noted that the average atomic percent described herein is representative of the entirety of the absorber layer 160, the atomic percentage of material at a particular location within the absorber layer 160 can be graded through the thickness compared to the overall composition of the absorber layer 160. For example, the absorber layer 160 can have a graded composition.

When the absorber layer 160 has a graded composition, the band gap of the absorber layer 160 can change throughout the thickness of the absorber layer 160, i.e., the band gap can be graded. In some embodiments, the absorber layer 160 can have a first band gap at the first surface 162 of the absorber layer 160 and a second band gap at the second surface 164 of the absorber layer 160. For example, the second band gap can be greater than the first band gap of the absorber layer 160. Generally, in operation, photons from sunlight having wavelengths corresponding with energy greater than the first band gap can be absorbed near the first surface 162 of the absorber layer 160. For example, sunlight can be transmitted through the substrate 110, the TCO layer 130, and the buffer layer 150 and absorbed by the absorber layer 160.

In embodiments where the absorber layer 160 comprises selenium and tellurium, the average atomic percent of the selenium in the absorber layer 160 can be greater than 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can be graded through the thickness of the absorber layer 160. For example, when the absorber layer 160 comprises a compound including selenium at a mole fraction of x and tellurium at a mole fraction of 1-x ($Se_xTe_{1-x}$), x can vary in the absorber layer 160 with distance from the first surface 162 of the absorber layer 160.

Referring still to FIG. 2, the absorber layer 160 can be doped with a dopant configured to manipulate the charge carrier concentration. In some embodiments, the absorber layer 160 can be doped with a Group V dopant such as, for example, arsenic, phosphorous, antimony, or a combination thereof. Alternatively or additionally, the absorber layer 160 can be doped with a Group IB dopant such as, for example, copper, silver, gold, or a combination thereof. The total density of the dopant within the absorber layer 160 can be controlled. Moreover, the amount of the dopant can vary with distance from the first surface 162 of the absorber layer 160.

According to the embodiments provided herein, the p-n junction can be formed by providing the absorber layer 160 sufficiently close to a portion of the photovoltaic device 100 having an excess of negative charge carriers, i.e., electrons or donors. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150 such that the at least a portion of the second surface 154 and the first surface 162 are in direct contact.

The photovoltaic device 100 can include a back contact layer 170 configured to mitigate undesired alteration of the dopant and to provide electrical contact to the absorber layer 160. The back contact layer 170 can have a first surface 172 substantially facing the front side 102 of the photovoltaic device 100 and a second surface 174 substantially facing the back side 104 of the photovoltaic device 100. A thickness of the back contact layer 170 can be defined between the first surface 172 and the second surface 174. The thickness of the back contact layer 170 can be between about 5 nm to about 200 nm such as, for example, between about 10 nm to about 50 nm in one embodiment.

In some embodiments, the back contact layer 170 can be provided adjacent to the absorber layer 160. For example, the first surface 172 of the back contact layer 170 can be provided upon the second surface 164 of the absorber layer 160. In some embodiments, the back contact layer 170 can include combinations of materials from Groups I, II, VI, such as for example, one or more layers containing zinc and tellurium in various compositions. Further exemplary materials include, but are not limited to, a bilayer of cadmium zinc telluride and zinc telluride, or zinc telluride doped with a group V dopant such as, for example, nitrogen.

Figure 4:
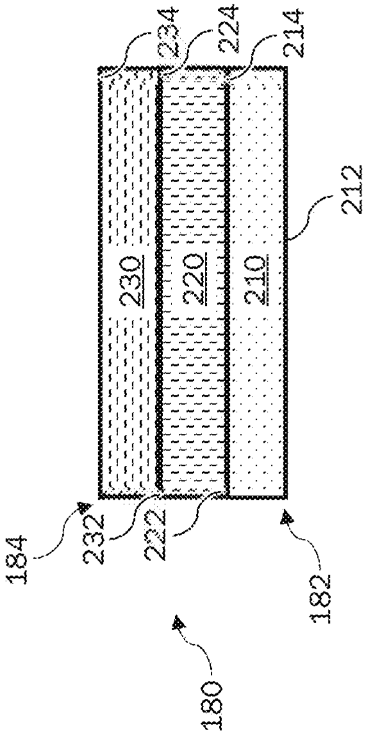
FIG. 4 schematically depicts the conducting layer of the photovoltaic device of FIGS. 1 and 2 according to one or more embodiments shown and described herein.

Referring collectively to FIGS. 2, and 4, the photovoltaic device 100 can include a conducting layer 180 configured to provide electrical contact with the back contact layer 170, the absorber layer 160, or both. The conducting layer 180 can have a first surface 182 substantially facing the front side 102 of the photovoltaic device 100 and a second surface 184 substantially facing the back side 104 of the photovoltaic device 100. In some embodiments, the conducting layer 180 can be provided adjacent to the back contact layer 170 or the absorber layer 160. For example, the first surface 182 of the conducting layer 180 can be provided upon the second surface 174 of the back contact layer 170 or the second surface 162 of the absorber layer 160. A thickness of the conducting layer 180 can be defined between the first surface 182 and the second surface 184. The thickness of the conducting layer 180 can be less than about 500 nm such as, for example, between about 40 nm and about 400 nm in one embodiment, or between about 60 nm and about 350 nm.

According to the embodiments provided herein, the conducting layer 180 can include one or more functional layers of material. The conducting layer 180 can have an average transmittance percentage of at least 80% over a transmittance range from about 600 nm to about 900 nm. The conducting layer 180 can include a diffusion barrier layer 210 operable to limit diffusion of metal species into active areas of the cell 200 such as, for example, the absorber layer 160. Diffusion of metal species into the absorber layer 160 can degrade conversion efficiency of the cell 200. Such degradation and decreased performance can be particularly associated with hot and/or humid environments. Accordingly, the use of a suitable diffusion barrier 210 can improve performance of the photovoltaic device 100.

The diffusion barrier layer 210 can have a first surface 212 substantially facing the front side 102 of the photovoltaic device 100 and a second surface 214 substantially facing the back side 104 of the photovoltaic device 100. A thickness of the diffusion barrier layer 210 can be defined between the first surface 212 and the second surface 214. The thickness of the diffusion barrier layer 210 can be less than about 125 nm such as, for example, between about 2 nm and about 100 nm in one embodiment, or between about 5 nm and about 50 nm in another embodiment.

In some embodiments, the diffusion barrier layer 210 can be provided adjacent to the back contact layer 170. For example, the first surface 212 of the diffusion barrier layer 210 can be provided upon the second surface 174 of the back contact layer 170. Thus, in some embodiments, the first surface 182 of the back contact layer 180 can be formed by the first surface 212 of the diffusion barrier layer 210. Generally, the diffusion barrier layer 210 can be formed by a material with suitable transmittance capable of being doped "+" type. For example, charge densities of greater than about $1\times10^{16}$ $cm^{-3}$ can be considered to be "+" type. In some embodiments, the diffusion barrier layer 210 can be doped n+. In alternative embodiments, the diffusion barrier layer 210 can be doped p+. Although the boundaries are not rigid, a material can be considered n-type if electron donor carriers are present in the range of about $1\times10^{11}$ $cm^{-3}$ to about $1\times10^{16}$ $cm^{-3}$, and n+ type if donor carrier density is greater than about $1\times10^{16}$ $cm^{-3}$. Similarly, a material is generally considered p-type if electron acceptor carriers (i.e. "holes") are present in the range of about $1\times10^{11}$ $cm^{-3}$ to about $1\times10^{16}$ $cm^{-3}$, and p+ type if acceptor carrier density is greater than about $1\times10^{16}$ $cm^{-3}$. The boundaries are not rigid and may overlap because a layer may be p+ relative to a layer that is p-type (or n+ relative to a layer that is n-type) if the carrier concentration is at least two orders of magnitude (i.e. 100-fold) higher, regardless of the absolute carrier density. Additionally, charge densities of greater than about $1\times10^{18}$ $cm^{-3}$ can be considered to be "++" type; and thus a layer of either n-type or p-type can be "++" relative to a layer of the same type that is itself "+" relative to yet a third layer, if the ++ layer has a same-type carrier density more than 100 fold that of the + layer.

Suitable materials for the diffusion barrier layer 210 can include refractory oxy-nitrides such as, for example, titanium oxy-nitrides ($TiN_xO_y$) or molybdenum oxy-nitrides ($MoN_xO_y$). Without being bound to theory, applicant has discovered that oxy-nitrides can exhibit improved optical properties, i.e., increased transmittance, with increased amounts of oxygen in the alloys. However, it is further believed that the electrical conductivity can degrade with the increased oxygen. Another group of materials suitable for use in the transparent diffusion barrier 310 include are transparent conductive oxides such as, for example, tin oxide ($SnO_2$) zinc oxide (ZnO), cadmium oxide (CdO), cadmium stannate ($Cd_2SnO_4$), and amorphous cadmium tin oxide ($Cd_xSnO_4$ material where $0.5\leq x\leq 2$). These transparent conductive oxides can be doped with impurities such as F, Al, In, Ga, Ti, and others to alter their electrical and optical properties.

Referring still to FIGS. 2 and 4, the conducting layer 180 can include a high conductivity layer 220 configured to provide low device series resistance. The high conductivity layer 220 can have a first surface 222 substantially facing the front side 102 of the photovoltaic device 100 and a second surface 224 substantially facing the back side 104 of the photovoltaic device 100. A thickness of the high conductivity layer 220 can be defined between the first surface 222 and the second surface 224. The thickness of the high conductivity layer 220 can be less than about 300 nm such as, for example, between about 30 nm and about 300 nm in one embodiment, between about 50 nm and about 250 nm in another embodiment, or between about 100 nm and about 250 nm in a further embodiment.

In some embodiments, the high conductivity layer 220 can be positioned further away from the absorber layer 160 or the back contact layer 170 relative to the diffusion barrier layer 210. Accordingly, the diffusion barrier layer 210 can be positioned between the absorber layer 160 and the high conductivity layer 220 or the back contact layer 170 and the high conductivity layer 220. Specifically, in some embodiments, the high conductivity layer 220 can be provided adjacent to the high-conductivity layer. For example, the first surface 222 of the high conductivity layer 220 can be provided upon the second surface 214 of the diffusion barrier layer 210. Generally, the high conductivity layer 220 can be formed by a material with suitable transmittance capable of being doped "++" type. In some embodiments, the diffusion barrier layer 210 can be doped n++. Accordingly, the high conductivity layer 220 can include a degeneratively doped transparent conductive oxide. In some embodiments, the high conductivity layer 220 can be doped n++ intrinsically or with an oxide dopant. Suitable oxide dopants include, but are not limited to, $In_2O_3$, $Ga_2O_3$, $TiO_2$, $Dy_2O_3$, $SnO_2$, $Y_2O_3$, $Al_2O_3$, or any combination thereof. Applicants discovered that cadmium oxide (CdO) such as, for example, indium oxide doped cadmium oxide ($CdO{:}In_2O_3$) or gallium oxide doped cadmium oxide ($CdO{:}Ga_2O_3$) had relatively high electrical mobility compared to other transparent conductive oxides of suitable optical properties. Accordingly, embodiments of the high conductivity layer 220 including cadmium oxide demonstrated a relatively high fill factor, and improved photovoltaic performance.

According to the embodiments provided herein, the conducting layer 180 can include a capping layer 230 operable to mitigate corrosion of the high conductivity layer 220 in hot and humid environments. The capping layer 230 can have a first surface 232 substantially facing the front side 102 of the photovoltaic device 100 and a second surface 234 substantially facing the back side 104 of the photovoltaic device 100. A thickness of the capping layer 230 can be defined between the first surface 232 and the second surface 234. The thickness of the capping layer 230 can be less than about 125 nm such as, for example, between about 2 nm and about 100 nm in one embodiment, or between about 5 nm and about 50 nm in another embodiment.

In some embodiments, the capping layer 230 can be positioned further away from the absorber layer 160 or the back contact layer 170 relative to the high conductivity layer 220. Accordingly, the high conductivity layer 220 can be positioned between the diffusion barrier layer 210 and the capping layer 230. Specifically, in some embodiments, the capping layer 230 can be provided adjacent to the high conductivity layer 220. For example, the first surface 232 of the capping layer 230 can be provided upon the second surface 224 of the high conductivity layer 220. The capping layer 230 can include a transparent conductive oxide, such as, for example, cadmium stannate. In some embodiments, the capping layer can include amorphous cadmium stannate.

Referring again to FIG. 2, the photovoltaic device 100 can include a bifacial enhancement layer 190 configured to alter the electromagnetic spectrum of albedo reflectance transmitted through the back side 104 of the photovoltaic device 100. The bifacial enhancement layer 190 can have a first surface 192 substantially facing the front side 102 of the photovoltaic device 100 and a second surface 194 substantially facing the back side 104 of the photovoltaic device 100. A thickness of the bifacial enhancement layer 190 can be defined between the first surface 192 and the second surface 194. The thickness of the bifacial enhancement layer 190 can be less than 1,000,000 nm. The thickness of the bifacial enhancement layer 190 can be between about 50 nm to about 500,000 nm such as, for example, between 50 nm to 50,000 nm, between 50 nm to 5,000 nm, or between about 100 nm to about 2,500 nm in some embodiments.

Figure 5:
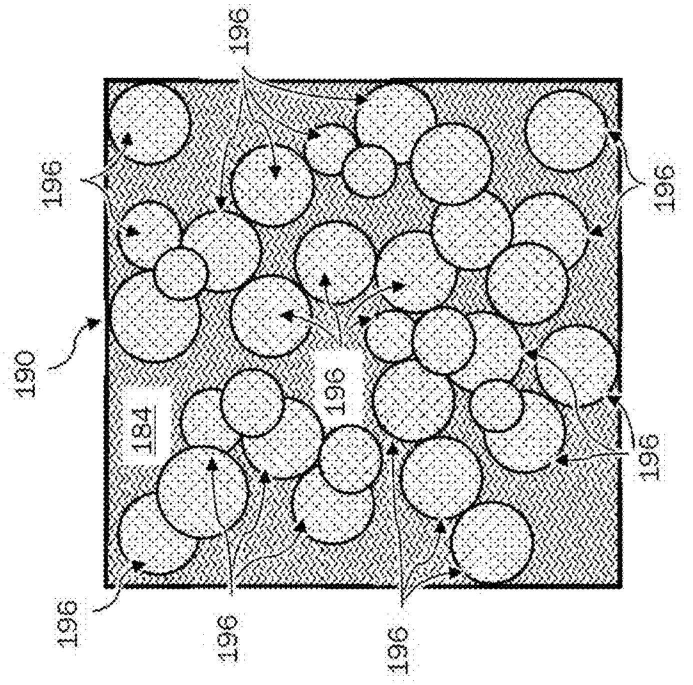
FIG. 5 schematically depicts a bifacial enhancement layer according to one or more embodiments shown and described herein.

Referring collectively to FIGS. 2 and 5, the bifacial enhancement layer 190 can include a plurality of nanometer scale particles such as, for example, nanocrystals or quantum dots 196. Generally, nanometer scale particles are bodies having an average diameter of less than about 50 nm. Average size of particles in a layer may be measured in a cross-section of the layer using electron microscopcopy and image processing. Suitable nanocrystals can be formed from perovskite materials such as, for example, compounds having an $ABX_3$ composition. A can include one or more of cesium, methylammonium, or formamidinium. B can include one or more metals such as, for example, lead or tin. X can include one or more halide such as, for example, chlorine, bromine, or iodine.

Figure 6:
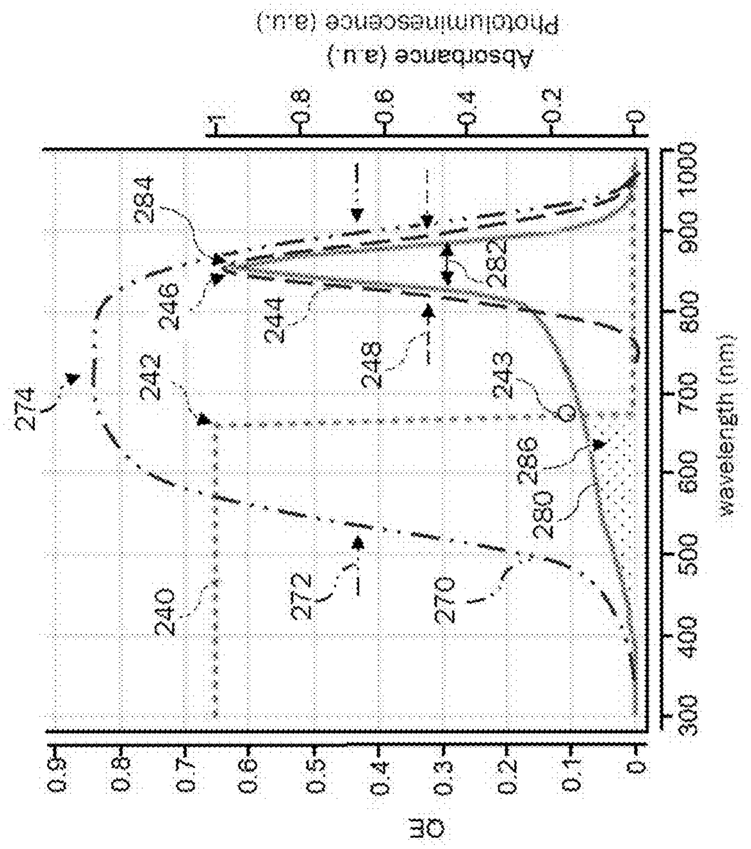
FIG. 6 graphically depicts photoluminescence, absorbance, and quantum efficiency according to one or more embodiments shown and described herein.

Referring collectively to FIGS. 2 and 6, the bifacial enhancement layer 190 can be characterized by an absorption spectrum 240, which can be tailored to cooperate with the absorber layer 160 according to the embodiments provided herein. FIG. 6 graphically depicts absorbance of an embodiment of the bifacial enhancement layer 190, with arbitrary units (a.u.) in accordance with the right vertical axis plotted versus wavelength (nm). Absorbance is scaled such that a value of 1 corresponds to 100% of light at the corresponding wavelength incident to the bifacial enhancement layer 190 being absorbed by the bifacial enhancement layer 190. The absorption spectrum 240 can include an absorption edge 242. The absorption edge 242 can be a discontinuity in the slope of the absorption spectrum 240 demarcating the portion of the absorption spectrum 240 that includes a loss of most of the absorbance of the absorption spectrum 240. As provided herein, the absorption spectrum 240 can have a cutoff wavelength 243 that corresponds to the wavelength of the absorbance equal to 15% of the maximum absorbance of the absorption spectrum 242. The cutoff wavelength 243 can be located along the absorption edge 242 demarcate lack of effective absorbance. It is noted that, while the cutoff wavelength 243 of the absorption edge 242 is depicted in FIG. 6 as being about 660 nm, the cutoff wavelength 243 of the absorption edge 242 can be varied in accordance with the present disclosure. In some embodiments, the cutoff wavelength 243 of the absorption edge 242 can be less than or equal to 800 nm such as, for example, greater than or equal to about 600 nm and less than or equal to about 800 nm in one embodiment.

FIG. 6 further graphically depicts emitted photoluminescence 244 of an embodiment of the bifacial enhancement layer 190, which can be tailored to cooperate with the absorber layer 160 according to the embodiments provided herein. The emitted photoluminescence 244 is plotted versus wavelength (nm) with arbitrary units in accordance with the right vertical axis. Generally, the bifacial enhancement layer 190 can be configured to "downshift" light. Accordingly, the emitted photoluminescence 244 can have a peak 246 having a longer wavelength than the cutoff wavelength 243 of the absorption spectrum 240. Alternatively or additionally, the emitted photoluminescence 244 can have a full width at half maximum (FWHM) 248 such that a majority of the energy of the incoming light is shifted to a longer wavelength than the cutoff wavelength 243 of the absorption spectrum 240.

In embodiments including quantum dots 196, each quantum dot 196 can be formed from a semiconductor material or a plurality of semiconductor materials, i.e., core/shell configuration. Suitable semiconductor materials include I-III-VI nanocrystals or II-VI semiconductor nanocrystals such as, for example, copper indium sulfide, silver indium sulfide, lead sulfide, lead selenide, cadmium selenide, cadmium sulfide, cadmium telluride, indium arsenide, and indium phosphide. The quantum dots 196 can have an average diameter less than about 50 nm, or less than about 20 nm, such as, for example, greater than about 0.1 nm and less than 15 nm in an embodiment, greater than about 1 nm and less than 10 nm in one embodiment, greater than 4 nm and less than 13 nm, greater than 2 nm and less than 8 nm, or greater than about 1 nm and less than about 5 nm in another embodiment. The nanometer scale of the quantum dots 196 imbue the quantum dots 196 with optical properties that differ from larger objects formed from the same material. The absorbance and photoluminescence of the quantum dot 196 can be tuned as a function of the band gap of the semiconductor material and the diameter of the quantum dot 196. For a given band gap, an increase in diameter of the quantum dot 196 can increase the wavelength of the peak of the photoluminescence. Generally, the quantum dots 196 can have an average absorption coefficient greater than $10^4$ $cm^{-1}$ for wavelengths from 400 nm to 800 nm.

In some embodiments, the bifacial enhancement layer 190 can include stacked formation of quantum dots 196. For example, the bifacial enhancement layer 190 can include plurality of quantum dots 196 that are layered over one another to form a thickness. The quantum dots 196 can be dispersed such that a plurality of gaps are present in the bifacial enhancement layer 190. The gaps can be open, or filled with a filler material such as, for example, a transparent material. Accordingly, in some embodiments, the quantum dots 196 can fill at least about 1% of the volume of the bifacial enhancement layer 190 such as, for example, equal to or greater than 2%, equal to or greater than 5%, between 5% and 45%, between 15% and 35%, or between 20% and 30%, of the volume of the bifacial enhancement layer 190. In some embodiments, the quantum dots 196 can fill at least about 55% of the volume of the bifacial enhancement layer 190 such as, for example, between about 60% and 90% of the volume of the bifacial enhancement layer 190. Alternatively or additionally, the quantum dots 196 can be applied directly to the second surface 184 of the conducting layer 180. The quantum dots 196 can be provided at an area density greater than 55% on the second surface 184 of the conducting layer 180. In some embodiments, the quantum dots 196 can be provided at an area density, with respect to the second surface 184 of the conducting layer 180, in a range of 55% to 100%, 65% to 95%, 75% to 99%, 80% to 100%, or 90% to 100%.

Referring again to FIG. 2, the photovoltaic device 100 can include an interlayer 198 configured to provide moisture protection to the photovoltaic device 100. The interlayer 198 can include a transparent material that can flow prior to or during the curing process such as, but not limited to, a thermoplastic material. The thermoplastic material can include an acrylonitrile butadiene styrene (ABS), an acrylic (PMMA), a celluloid, a cellulose acetate, a cycloolefin copolymer (COC), a polyvinyl butyral (PVB), a silicone, an epoxy, an ethylene-vinyl acetate (EVA), an ethylene vinyl alcohol (EVOH), a fluoroplastic (PTFE), an ionomer, KYDEX®, a liquid crystal polymer (LCP), a polyacetal (POM), a polyacrylate, a polyacrylonitrile (PAN), a polyamide (PA), a polyamide-imide (PAI), a polyaryletherketone (PAEK), a polybutadiene (PBD), a polybutylene (PB), a polybutylene terephthalate (PBT), a polycaprolactone (PCL), a polychlorotrifluoroethylene (PCTFE), a polyethylene terephthalate (PET), a polycyclohexylene dimethylene terephthalate (PCT), a polycarbonate (PC), a polyhydroxyalkanoate (PHA), a polyketone (PK), a polyester, polyethylene (PE), a polyetheretherketone (PEEK), a polyetherketoneketone (PEKK), a polyetherimide (PEI), a polyethersulfone (PES), a polyethylenechlorinate (PEC), a polyimide (PI), a polylactic acid (PLA), a polymethylpentene (PMP), a polyphenylene oxide (PPO), a polyphenylene sulfide (PPS), a polyphthalamide (PPA), a polypropylene (PP), a polystyrene (PS), a polysulfone (PSU), a polytrimethylene terephthalate (PTT), a polyurethane (PU), a polyvinyl acetate (PVA), a polyvinyl chloride (PVC), a polyvinylidene chloride (PVDC), or a styrene-acrylonitrile (SAN), or any other suitable material, or any combination thereof. In certain embodiments, interlayer 198 can include an ethylene vinyl acetate (EVA), a polyvinyl butyral (PVB), a silicone, or an epoxy.

In some embodiments, the interlayer 198 can be provided over the bifacial enhancement layer 190. Accordingly, the bifacial enhancement layer 190 can be positioned between the interlayer 198 and the conducting layer 180. Optionally, the interlayer 198 can be adjacent to the bifacial enhancement layer 190. In some embodiments, the interlayer 198 can directly contact the quantum dots 196 of the bifacial enhancement layer 190. Alternatively or additionally, the bifacial enhancement layer 190 and the interlayer 198 can be combined into a single layer. For example, the quantum dots 196 (FIG. 5) can be distributed within the interlayer 198.

The photovoltaic device 100 can include a back support 250 configured to cooperate with the substrate 110 to form a housing for the photovoltaic device 100. The back support 250 can be disposed at the back side 104 of the photovoltaic device 100. The back support 250 can have a first surface 252 substantially facing the front side 102 of the photovoltaic device 100 and a second surface 254 substantially facing the back side 104 of the photovoltaic device 100. The back support 250 can include any suitable transparent material, including, for example, borosilicate glass, float glass, soda lime glass, carbon fiber, or polycarbonate. The back support 250, the substrate 110, and interlayer 198 can protect the various layers of the photovoltaic device 100 from exposure to moisture and other environmental hazards. In some embodiments, the substrate 110 and the back support 250 can be bonded together with the interlayer 198 through a lamination process. For example, the first surface 252 of the back support 250 can directly contact the interlayer 198.

Figure 7:
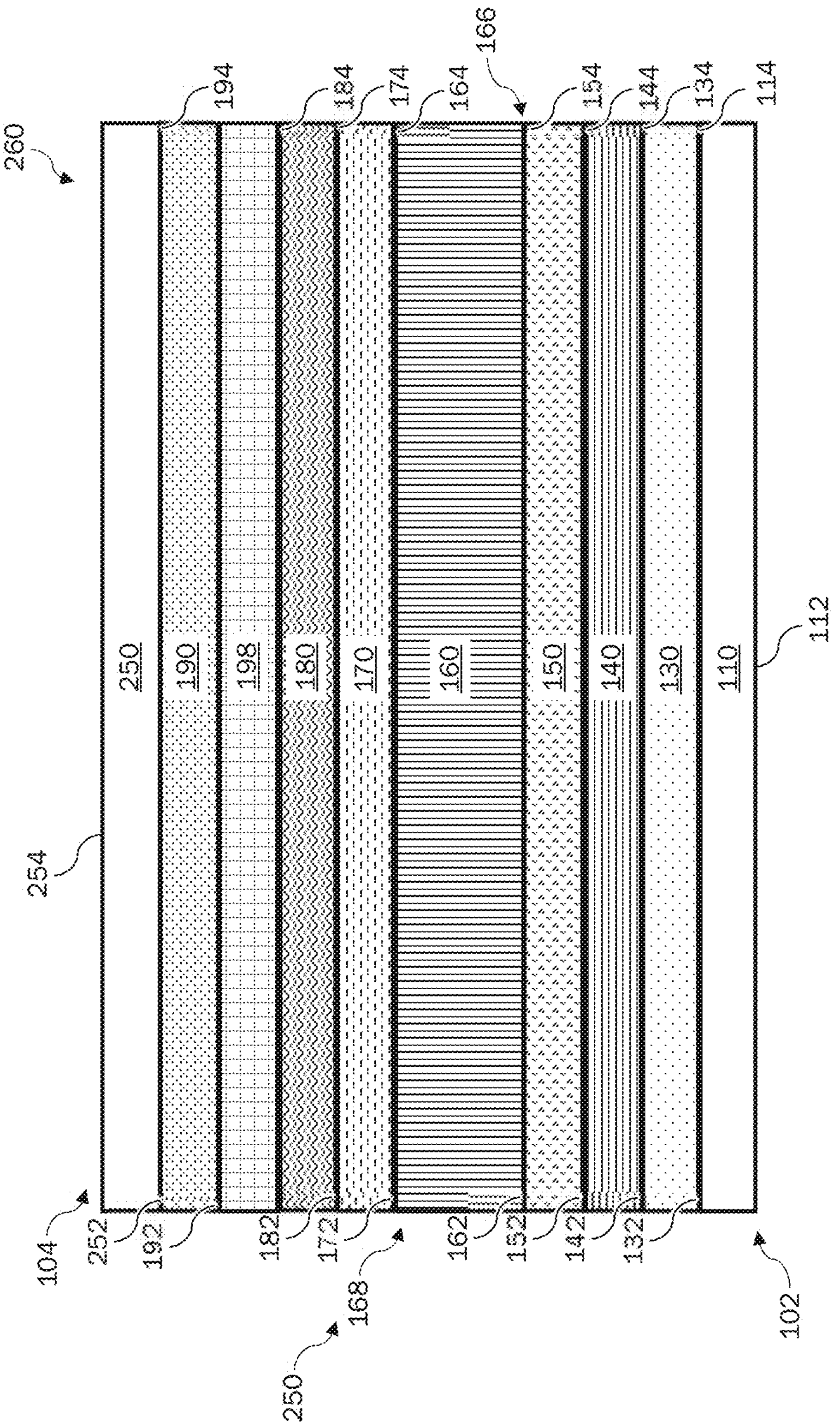
FIG. 7 schematically depicts a cross-sectional view of an alternative photovoltaic device according to one or more embodiments shown and described herein.

Referring now to FIG. 7, embodiments of a photovoltaic device 260 can include the bifacial enhancement layer 190 positioned between the back support 250 and the interlayer 198. For example, the second surface 194 of the bifacial enhancement layer 190 can directly contact the first surface 252 of the back support 250.

Referring collectively to FIGS. 2, 6, and 7, embodiments of the bifacial enhancement layer 190 are configured to improve the bifacial performance of photovoltaic devices 100, 260. In some instances, photovoltaic devices 100, 260 can be more efficient at converting light initially received at a front interface 166 of the absorber layer 160 compared to light initially received at a back interface 168 of the absorber layer 160. The front interface 166 can be formed between the first surface 162 of the absorber layer 160 and an adjacent stack of layers configured to transport electrons during light conversion. In some embodiments, the front interface 166 can be formed between the first surface 162 of the absorber layer 160 and the second surface 154 of the buffer layer 150. The back interface 168 can be formed between the second surface 164 of the absorber layer 160 and an adjacent stack of layers configured to transport holes during light conversion. In some embodiments, the back interface 168 can be formed between the second surface 164 of the absorber layer 160 and the first surface 172 of the back contact 170.

In contrast to silicon based photovoltaic devices, thin-film photovoltaic devices such as, for example, devices with CdTe, CdSe or the like, can have inefficient back interfaces 168 compared to the front interface 166. The inefficiency can be impacted by the specific composition of the absorber layer 160 and dopant levels of the absorber layer 160. Moreover, inefficiency can be caused by other factors including the composition of any layers adjacent to the absorber layer 160, interface passivation, and manufacturing processes. Specifically, the back interface 168 can have a relatively high surface recombination velocity and low carrier lifetime, which can reduce the amount of light that can be converted into electrical power. Put simply, a relatively high amount of the energy of the light initially received at the back interface 168 can be lost to carrier recombination before the energy can be delivered as electrical power. Surface recombination velocity of the back interface 168 can be undesirably increased by morphological defects such as, for example, dislocations and planar defects (e.g., grain boundaries and surface interfaces) and by surface charge, which may give rise to band bending. Accordingly, the efficiency can be improved by various changes to the compositional changes such as, but not limited to, changing the material of the absorber layer 160, improving the morphology of the back interface 168, passivating the back interface 168, or any combination thereof. In contrast, the embodiments provided herein relate to the use of bifacial enhancement layers 190 to improve the efficiency of the absorber layer 160 without directly changing composition the absorber layer 160, the back interface 168, or both.

Referring still to FIGS. 2, 6, and 7, reduced average quantum efficiency to light received at the back interface 168 compared to light received at the front interface 166 can be indicative of an undesirable increase in surface recombination velocity at the back interface 168 relative to the front interface 166. A quantum efficiency profile 270 of an exemplary front interface 166 and a quantum efficiency profile 280 of an exemplary back interface 168 are plotted versus wavelength in FIG. 6. The back interface 168 can have a reduced average quantum efficiency compared to the front interface 166. Specifically, the average quantum efficiency of the back interface 168 to light between 500 nm and 900 nm the can be less than or equal to 50% and greater than or equal to 5% of the average quantum efficiency of the front interface 166 to light between 500 nm and 900 nm such as for example, less than or equal to 45% and greater than or equal to 8% in one embodiment, or less than or equal to 40% and greater than or equal to 10% in another embodiment.

The quantum efficiency profile 270 of light received first by the front interface 166 of the absorber layer 160 has a FWHM 272 and a peak 274 as indicated. Likewise, the quantum efficiency profile 280 of light received first by the back interface 168 of the absorber layer 160 has a FWHM 282 and a peak 284. As noted above, the front interface 166 can be more efficient at power conversion than the back interface 168. Accordingly, the FWHM 272 of the quantum efficiency profile 270 of the front interface 166 can be greater than the FWHM 282 of the quantum efficiency profile 280 of the back interface 168 such as, for example, the FWHM 272 of the quantum efficiency profile 270 can be at least 2 times larger than the FWHM 282 of the quantum efficiency profile 280 in one embodiment, or the FWHM 272 of the quantum efficiency profile 270 can be at least 3 times larger than the FWHM 282 of the quantum efficiency profile 280 in another embodiment. Alternatively or additionally, the peak 274 of the quantum efficiency profile 270 of the front interface 166 can be greater than the peak 284 of the quantum efficiency profile 280 of the back interface 168 such as, for example, the peak 274 of the quantum efficiency profile 270 can be at least 1.1 times larger than the peak 284 of the quantum efficiency profile 280 in one embodiment, or the peak 274 of the quantum efficiency profile 270 can be at least 1.2 times larger than the peak 284 of the quantum efficiency profile 280 in another embodiment.

As provided herein, the bifacial enhancement layer 190 can be configured to improve power conversion efficiency of the back interface 168 to albedo reflectance. Generally, the bifacial enhancement layer 190 can be operable to interact with albedo reflectance over a broad spectrum of wavelengths to convert the albedo reflectance into a more narrow photoluminescence spectrum. In some embodiments, the bifacial enhancement layer 190 can absorb light having a wavelength of 400 nm to 800 nm. For example, the bifacial enhancement layer 190 can absorb at least about 85% of the incident photons having wavelengths from 400 nm to 800 nm, such as, for example, between 85% to 100%, at least 85%, or at least about 90%, of the incident photons having wavelengths from 400 nm to 800 nm. In another example, the bifacial enhancement layer 190 can absorb at least about 50% of the incident photons having wavelengths from 400 nm to 800 nm, such as, for example, between 50% to 95%, between 60% to 95%, at least 65%, at least 70%, at least 75%, at least 80%, at least 85%, or at least about 90%, of the incident photons having wavelengths from 400 nm to 800 nm in some embodiments, or at least about 95% of the incident photons having wavelengths from 400 nm to 800 nm in another embodiment.

According to the embodiments provided herein, the emitted photoluminescence 244 provided by the bifacial enhancement layer 190 can have a peak 246 at a frequency corresponding to a downshift of light. For example, the wavelength of the peak 246 of the photoluminescence can be greater than about 820 nm such as, for example, between 825 nm and 875 nm in one embodiment, greater than or equal to 830 nm and less than or equal to 870 nm in another embodiment, or greater than or equal to 840 nm and less than or equal to 860 nm in another embodiment. Alternatively or additionally, the emitted photoluminescence 244 provided by the bifacial enhancement layer 190 can have a relatively narrow peak compared to the albedo reflectance. For example, the peak 246 of the emitted photoluminescence can have a FWHM 248 of less than 100 nm such as, for example, less than 60 nm in one embodiment, or between about 10 nm and 50 nm in another embodiment. Alternatively or additionally, the quantum yield of incident photons having wavelengths from 400 nm to 800 nm converted into the peak 246 of the emitted photoluminescence 244 can be greater than 50% such as, for example, greater than about 60% in one embodiment.

Referring still to FIGS. 2, 6, and 7, according to the present disclosure, the bifacial performance of embodiments the photovoltaic device 100, 260 can be improved by downshifting light towards the peak 284 of the quantum efficiency profile 280 of the back interface 168. It is noted that such downshifting can result in current loss. For example, loss in short circuit current $J_{SC}$ can be correlated to the overlap 286 between the absorption spectrum 240 of the bifacial enhancement layer 190 and the quantum efficiency profile 280 of the back interface 168. Accordingly, for a given absorber layer 160, the absorption edge 242 of the bifacial enhancement layer 190 can influence the amount of short circuit current $Jsc_{Loss}$ that is lost due to absorption by the bifacial enhancement layer 190.

The relationship is provided below as Equation 1, where QE(λ) is the wavelength dependent quantum efficiency of the back interface 168, RI(λ) is the wavelength dependent rear side irradiance and AB(λ) is the wavelength dependent absorption of the $$Jsc_{Loss} = \int_0^{\infty} AB(\lambda) \cdot RI(\lambda) \cdot QE(\lambda) d\lambda \quad \text{(Equation 1)}$$

In some embodiments, the amount of short circuit current $Jsc_{Loss}$ due to absorption by the bifacial enhancement layer 190 can be less than about 20 mA/cm$^2$ such as, for example, greater than or equal to 0.05 mA/cm$^2$ and less than or equal to 15 mA/cm$^2$ in one embodiment, or greater than or equal to 0.5 mA/cm$^2$ and less than or equal to 10 mA/cm$^2$ in another embodiment.

Referring collectively to FIGS. 2, 4, and 6, the intervening layers of the photovoltaic device 100, 260 can be configured to transmit the emitted photoluminescence 244 of the bifacial enhancement layer 190. For example, the back contact layer 170, the conducting layer 180, the interlayer 198, or any combination thereof can have a transmittance of 85% or more to the wavelength of the peak 246 of the emitted photoluminescence 244 of the bifacial enhancement layer 190 such as, for example, a transmittance of 90% or more in one embodiment.

Examples

Figure 8:
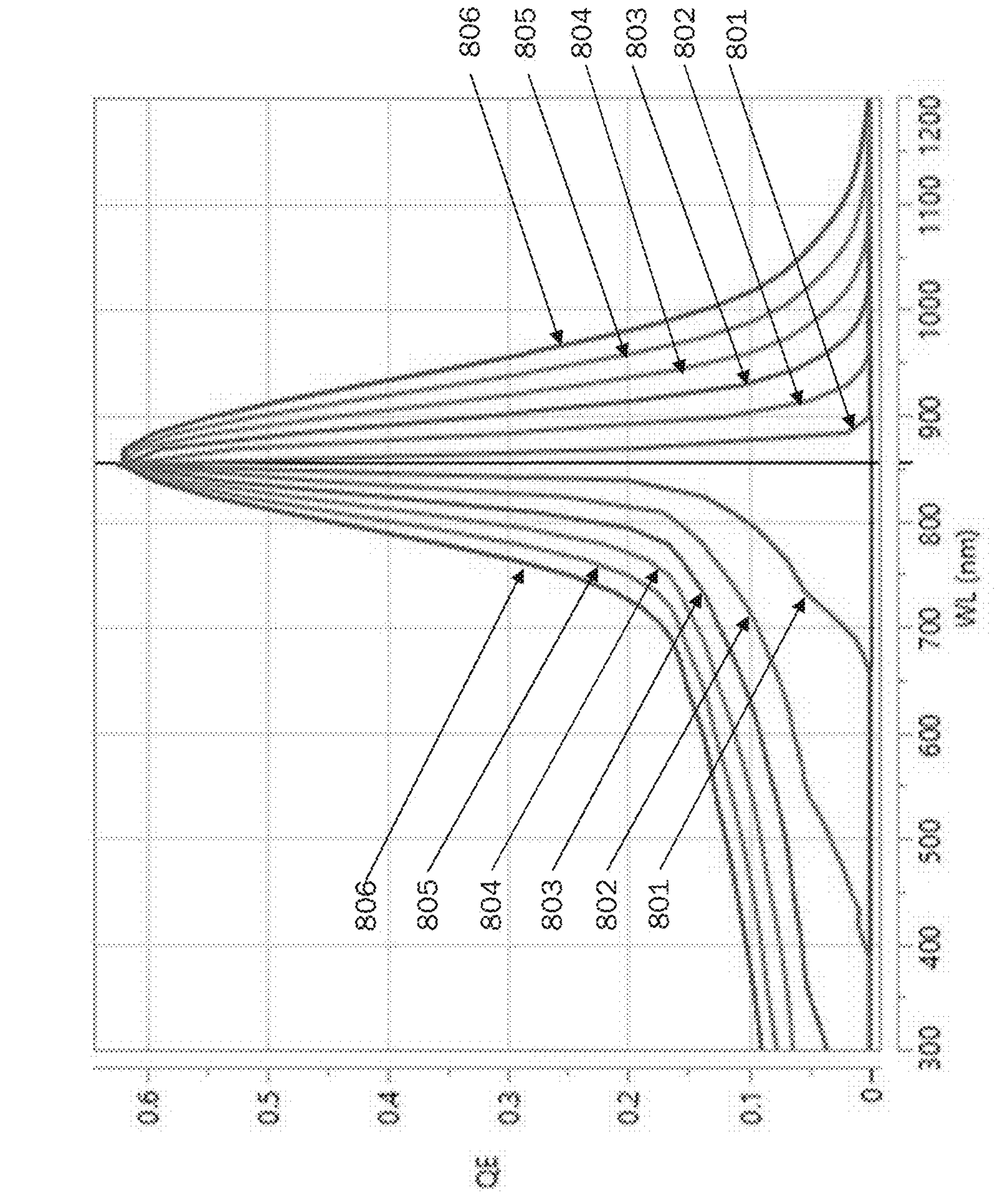
FIG. 8 graphically depicts quantum efficiency of back interfaces according to one or more embodiments shown and described herein.
Figure 9:
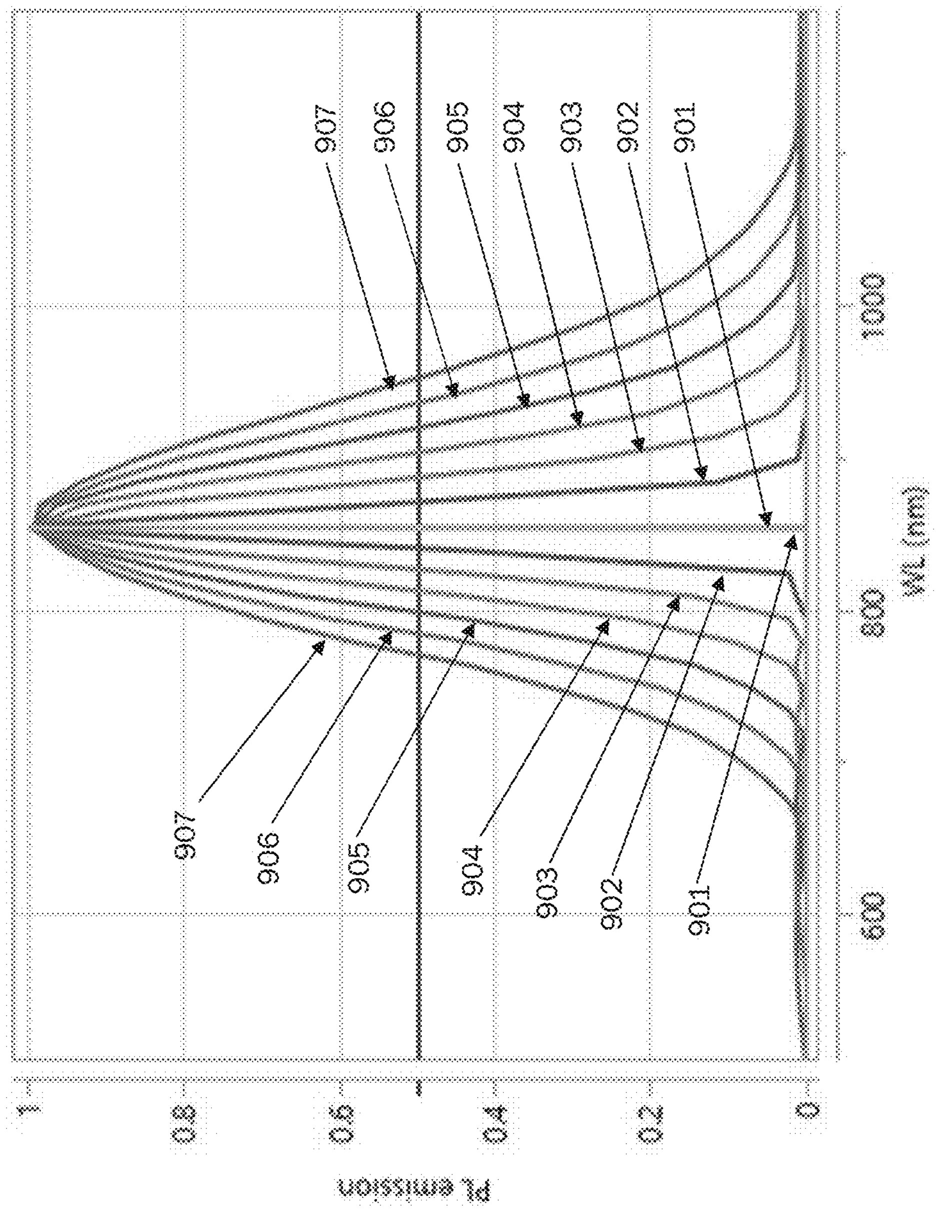
FIG. 9 graphically depicts emitted photoluminescence of bifacial enhancement layers according to one or more embodiments shown and described herein.

Referring collectively to FIGS. 8 and 9, various examples of embodiments of the present disclosure were simulated to determine the net gain in short circuit current $J_{SC}$ attributable to the use of the bifacial enhancement layers described herein. The net change in short circuit current $Jsc_{Net}$ is given by Equations 2 and 3 below, where QY is the quantum yield of the bifacial enhancement layer 190, AB(λ) is the wavelength dependent absorption of the bifacial enhancement layer 190, RI(λ) is the wavelength dependent rear side irradiance, PL(λ) is the wavelength dependent photoluminescence of the bifacial enhancement layer 190 and QE(λ) is the wavelength dependent quantum efficiency of the back interface 168:

$$Jsc_{Net} = Jsc_{Gain} - Jsc_{Loss} \quad \text{(Equation 2)}$$

$$Jsc_{Gain} = QY \int_0^{\infty} AB(\lambda) \cdot RI(\lambda) d\lambda \int_0^{\infty} PL(\lambda) \cdot QE(\lambda) d\lambda \quad \text{(Equation 3)}$$

The peaks of the emitted photoluminescence (FIG. 9) of the simulated bifacial enhancement layers were aligned to the peaks of the quantum efficiency profiles (FIG. 8) of the simulated back interfaces. AM 1.5 spectrum was used as the optical input through the simulated bifacial enhancement layers. The FWHM of the quantum efficiency profiles (FIG. 8) of the simulated back interfaces were simulated at 22 nm, 55 nm, 88 nm, 120.7 nm, 153 nm, and 186 nm. FIG. 8 shows a 22 nm profile line 801, a 55 nm profile line 802, a 88 nm profile line 803, a 120.7 nm profile line 804, a 153 nm profile line 805, and a 186 nm profile line 806, respectively corresponding to the FWHM of the quantum efficiency profiles of the simulated back interfaces. The peak of the quantum efficiency profiles of the simulated back interfaces were held constant. The FWHM of the emitted photoluminescence (FIG. 9) of the simulated bifacial enhancement layers were simulated at 1 nm, 30 nm, 60 nm, 91 nm, 121 nm, 152 nm, and 183 nm. FIG. 9 shows a 1 nm line 901, a 30 nm line 902, a 60 nm line 903, a 91 nm line 904, a 121 nm line 905, a 152 nm line 906, and a 183 nm line 907, respectively corresponding to the FWHM of the emitted photoluminescence of the simulated bifacial enhancement layers. The peak of the emitted photoluminescence of the simulated bifacial enhancement layers back interfaces were held constant.

The simulations were performed using three different absorption profiles with an absorbance of 1 (a.u.) and the cutoff frequencies of the absorption edges at 660 nm, 720 nm, and 790 nm. The amount of short circuit current $Jsc_{Loss}$ (mA/cm$^2$) that is lost due to by the bifacial enhancement layer was determined for each absorption profile and each quantum efficiency profile. The results are provided below in Table 1.

TABLE 1

| Absorption Edge | QE FWHM-22 nm | QE FWHM-55 nm | QE FWHM-88 nm | QE FWHM-120.7 nm | QE FWHM-153 nm | QE FWHM-186 nm |
|---|---|---|---|---|---|---|
| 660 nm | 0.00 | 0.78 | 1.44 | 1.81 | 2.09 | 2.31 |
| 720 nm | 0.08 | 1.16 | 1.94 | 2.39 | 2.73 | 3.01 |
| 790 nm | 0.34 | 1.64 | 2.54 | 3.10 | 3.61 | 4.10 |

The simulations were performed for each emitted photoluminescence (FIG. 9) and quantum efficiency profile (FIG. 8) with a cutoff wavelength of the absorption edge at 660 nm. The net change in short circuit current $Jsc_{Net}$ (mA/cm$^2$) for each combination is provided below in Table 2.

TABLE 2

| | Emitted Photoluminescence | | | | | | |
|---|---|---|---|---|---|---|---|
| QE FWHM | 183 nm | 152 nm | 121 nm | 91 nm | 60 nm | 30 nm | 1 nm |
| 22 nm | 2.33 | 2.53 | 2.91 | 3.46 | 4.43 | 6.82 | 11.36 |
| 55 nm | 3.69 | 4.03 | 4.70 | 5.61 | 6.97 | 9.00 | 10.58 |
| 88 nm | 4.53 | 4.94 | 5.73 | 6.70 | 7.89 | 9.19 | 9.92 |
| 120.7 nm | 5.28 | 5.68 | 6.48 | 7.36 | 8.29 | 9.14 | 9.55 |
| 153 nm | 5.85 | 6.21 | 6.95 | 7.70 | 8.42 | 9.01 | 9.27 |
| 186 nm | 6.31 | 6.51 | 7.25 | 7.88 | 8.44 | 8.87 | 9.05 |

The simulations were performed for each emitted photoluminescence (FIG. 9) and quantum efficiency profile (FIG. 8) with a cutoff wavelength of the absorption edge at 720 nm. The net change in short circuit current $Jsc_{Net}$ (mA/cm$^2$) for each combination is provided below in Table 3.

TABLE 3

| | Emitted Photoluminescence | | | | | | |
|---|---|---|---|---|---|---|---|
| QE FWHM | 183 nm | 152 nm | 121 nm | 91 nm | 60 nm | 30 nm | 1 nm |
| 22 nm | 2.77 | 3.01 | 3.48 | 4.16 | 5.34 | 8.27 | 13.83 |
| 55 nm | 4.31 | 4.73 | 5.55 | 6.67 | 8.33 | 10.81 | 12.75 |
| 88 nm | 5.37 | 5.87 | 6.84 | 8.03 | 9.48 | 11.07 | 11.97 |
| 120.7 nm | 6.29 | 6.78 | 7.76 | 8.84 | 9.97 | 11.02 | 11.52 |
| 153 nm | 7.00 | 7.43 | 8.34 | 9.26 | 10.13 | 10.86 | 11.18 |
| 186 nm | 7.54 | 7.89 | 8.69 | 9.46 | 10.15 | 10.68 | 10.90 |

The simulations were performed for each emitted photoluminescence (FIG. 9) and quantum efficiency profile (FIG. 8) with a cutoff wavelength of the absorption edge at 780 nm. The net change in short circuit current $Jsc_{Net}$ (mA/cm$^2$) for each combination is provided below in Table 4.

TABLE 4

| | Emitted Photoluminescence | | | | | | |
|---|---|---|---|---|---|---|---|
| QE FWHM | 183 nm | 152 nm | 121 nm | 91 nm | 60 nm | 30 nm | 1 nm |
| 22 nm | 3.01 | 3.30 | 3.85 | 4.64 | 6.03 | 9.48 | 16.00 |
| 55 nm | 4.79 | 5.28 | 6.25 | 7.56 | 9.51 | 12.43 | 14.70 |
| 88 nm | 6.05 | 6.64 | 7.78 | 9.17 | 10.89 | 12.75 | 13.80 |
| 120.7 nm | 7.10 | 7.68 | 8.83 | 10.10 | 11.43 | 12.66 | 13.24 |
| 153 nm | 7.82 | 8.33 | 9.40 | 10.48 | 11.51 | 12.37 | 12.73 |
| 186 nm | 8.30 | 8.71 | 9.65 | 10.56 | 11.37 | 12.00 | 12.24 |

The simulations summarized in Tables 2-4 increased performance, i.e., high net change in short circuit current $Jsc_{Net}$ through downshifting of the AM 1.5 spectrum. Generally, the net change in short circuit current $Jsc_{Net}$ can be improved by having a narrower FWHM of emitted photoluminescence. Additionally, narrowing FWHM of emitted photoluminescence tends to reduce sensitivity of the net change in short circuit current $Jsc_{Net}$ to broader FWHM of the quantum efficiency profile of the back interface. Conversely, broadening the FWHM of emitted photoluminescence tends to increase sensitivity of the net change in short circuit current $Jsc_{Net}$ to the FWHM of the quantum efficiency profile of the back interface.

It should now be understood that bifacial enhancement layers can be utilized as part of a high efficiency bifacial photovoltaic module. For example, downshifting layers can be utilized to reduce the energy level of albedo reflectance and allow for increased control of power conversion within the absorber layers. Such control can be used to implement bifacial photovoltaic modules with high power density and high efficiency without significant modification to absorber layer composition.

According to embodiments described herein, bifacial photovoltaic device can include an absorber layer and a bifacial enhancement layer. The absorber layer can have a front interface and a back interface. The front interface can have a front average quantum efficiency to light between 500 nm and 900 nm. The back interface can have a back average quantum efficiency to light between 500 nm and 900 nm. The back average quantum efficiency can be less than or equal to 50% of the front average quantum efficiency and greater than or equal to 5% of the front average quantum efficiency. The bifacial enhancement layer can be over the absorber layer and positioned closer to the back interface of the absorber layer compared to the front interface of the absorber layer. The bifacial enhancement layer can absorb light having an absorbed wavelength less than or equal to a cutoff frequency of an absorption edge of the bifacial enhancement layer. The cutoff frequency is a frequency of an absorbance equal to 15% of a maximum absorbance of the bifacial enhancement layer. The bifacial enhancement layer can emit an emitted photoluminescence having a peak. The wavelength of the peak of the emitted photoluminescence of the bifacial enhancement layer can be greater than the cutoff wavelength of the absorption edge. The peak of the photoluminescence of the bifacial enhancement layer can have a full width at half maximum of less than 100 nm.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A bifacial photovoltaic device comprising:

an absorber layer having a front interface and a back interface, wherein the front interface has a front average quantum efficiency to light between 500 nm and 900 nm and the back interface has a back average quantum efficiency to light between 500 nm and 900 nm, and wherein the back average quantum efficiency is less than or equal to 50% of the front average quantum efficiency and greater than or equal to 5% of the front average quantum efficiency; and a bifacial enhancement layer over the absorber layer and positioned closer to the back interface of the absorber layer compared to the front interface of the absorber layer, wherein:

the bifacial enhancement layer absorbs light having an absorbed wavelength less than or equal to a cutoff wavelength of an absorption edge of the bifacial enhancement layer;

the cutoff wavelength corresponds to an absorbance equal to 15% of a maximum absorbance of the bifacial enhancement layer;

the bifacial enhancement layer emits an emitted photoluminescence having a peak;

a wavelength of the peak of the emitted photoluminescence of the bifacial enhancement layer is greater than the cutoff wavelength of the absorption edge;

the peak of the photoluminescence of the bifacial enhancement layer has a full width at half maximum of less than 100 nm; and wherein the bifacial enhancement layer comprises quantum dots, and wherein the quantum dots comprise cadmium and tellurium.

2. The photovoltaic device of claim 1, wherein short circuit current $Jsc_{Loss}$ due to absorption by the bifacial enhancement layer is less than 20 $mA/cm^2$.

3. The photovoltaic device of claim 1, wherein the cutoff wavelength of the absorption edge is less than or equal to 800 nm.

4. The photovoltaic device of claim 1, comprising:

a transparent conductive oxide positioned over a substrate and between the substrate and the absorber layer; and a back support positioned over the bifacial enhancement layer, wherein the back support has a transmittance of 85% or more to the wavelength of the peak of the photoluminescence of the bifacial enhancement layer.

5. The photovoltaic device of claim 1, comprising a conducting layer over the absorber layer, and between the absorber layer and the bifacial enhancement layer, wherein the conducting layer has a transmittance of 85% or more to the wavelength of the peak of the photoluminescence of the bifacial enhancement layer.

6. The photovoltaic device of claim 1, comprising a back contact layer adjacent to the absorber layer, and positioned between the bifacial enhancement layer and the absorber layer, wherein the back contact layer has a transmittance of 85% or more to the wavelength of the peak of the photoluminescence of the bifacial enhancement layer.

7. The photovoltaic device of claim 1, wherein the absorber layer comprises selenium.

8. The photovoltaic device of claim 7, wherein the absorber layer comprises cadmium and tellurium, and the average atomic percent of the selenium in the absorber layer is greater than 0 atomic percent and less than or equal to about 25 atomic percent.

9. The photovoltaic device of claim 1, wherein the quantum dots have an average diameter of less than 20 nm.

10. The photovoltaic device of claim 9, wherein the bifacial enhancement layer has a thickness between 50 to 200,000 times the average diameter of quantum dots.

11. The photovoltaic device of claim 9, comprising a conducting layer over the absorber layer, wherein the quantum dots directly contact the conducting layer.

12. The photovoltaic device of claim 9, comprising an interlayer positioned over the quantum dots.

13. The photovoltaic device of claim 12, wherein the interlayer directly contacts the quantum dots.

14. The photovoltaic device of claim 9, wherein the quantum dots have an average absorbance coefficient of at least 104 cm-1 to photons having wavelengths from 400 nm to 800 nm.

15. The photovoltaic device of claim 9, wherein the quantum dots fill at least 15% of the volume of the bifacial enhancement layer.

16. The photovoltaic device of claim 1, wherein at least 50% of the photons having wavelengths from 400 nm to 800 nm incident to the bifacial enhancement layer are converted into the peak of the photoluminescence.

17. The photovoltaic device of claim 1, wherein the wavelength of the peak of the photoluminescence between 825 nm and 875 nm.

18. The photovoltaic device of claim 1, wherein:

the front interface has a front quantum efficiency profile;

the back interface has a back quantum efficiency profile; and a full width at half maximum of the front quantum efficiency profile is at least 2 times larger than a full width at half maximum of the back quantum efficiency profile.

19. The photovoltaic device of claim 1, wherein:

the front interface has a front quantum efficiency profile;

the back interface has a back quantum efficiency profile; and a peak of the front quantum efficiency profile is greater than a peak of the back quantum efficiency profile.

20. The photovoltaic device of claim 1, wherein the peak of the photoluminescence of the bifacial enhancement layer has a full width at half maximum in a range from 10 nm to 50 nm.

* * * * *